United States Patent
Lee et al.

(10) Patent No.: US 8,227,853 B2
(45) Date of Patent: Jul. 24, 2012

(54) SEMICONDUCTOR INTEGRATED CIRCUIT DEVICES HAVING CONDUCTIVE PATTERNS THAT ARE ELECTRICALLY CONNECTED TO JUNCTION REGIONS

(75) Inventors: Bong-Hyun Lee, Suwon-Si (KR); Jung-Yun Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/912,976

(22) Filed: Oct. 27, 2010

(65) Prior Publication Data

US 2011/0089534 A1    Apr. 21, 2011

Related U.S. Application Data

(62) Division of application No. 12/165,827, filed on Jul. 1, 2008, now Pat. No. 7,847,339.

(30) Foreign Application Priority Data

Jul. 2, 2007    (KR) .................. 10-2007-0066181

(51) Int. Cl.
 *H01L 29/788*    (2006.01)
(52) U.S. Cl. ... 257/322; 257/312; 257/347; 257/E21.32; 257/E21.444; 257/E21.445; 257/E21.545; 257/E21.547; 257/E21.557; 257/E21.585
(58) Field of Classification Search .............. 257/312, 257/322, 347, 662, 774, E21.32, E21.444, 257/E21.445, E21.545, E21.547, E21.557, 257/E21.585
See application file for complete search history.

(56) References Cited

U.S. PATENT DOCUMENTS

| | | | |
|---|---|---|---|
| 5,151,380 A | | 9/1992 | Hynecek |
| 5,402,459 A | * | 3/1995 | Hynecek ..................... 377/58 |
| 5,440,151 A | | 8/1995 | Crevel et al. |
| 5,464,992 A | | 11/1995 | Okabe et al. |
| 5,464,996 A | | 11/1995 | Hynecek |
| 5,576,557 A | | 11/1996 | Ker et al. |
| 5,710,452 A | | 1/1998 | Narita |
| 5,923,068 A | | 7/1999 | Lee et al. |
| 6,307,263 B1 | | 10/2001 | Savignac et al. |
| 7,433,637 B2 | * | 10/2008 | Aoki et al. .................. 399/297 |
| 7,847,339 B2 | * | 12/2010 | Lee et al. .................... 257/322 |
| 7,877,871 B2 | * | 2/2011 | Aoki et al. ..................... 29/846 |

FOREIGN PATENT DOCUMENTS

| | | |
|---|---|---|
| JP | 11-261006 | 9/1999 |
| JP | 2001068636 A | 3/2001 |
| JP | 2001-148464 | 5/2001 |
| JP | 2007-005447 | 1/2007 |
| KR | 1020040078273 A | 9/2004 |
| KR | 100816756 B1 | 3/2008 |

* cited by examiner

*Primary Examiner* — David Nhu
(74) *Attorney, Agent, or Firm* — Myers Bigel Sibley & Sajovec

(57) ABSTRACT

A semiconductor integrated circuit device includes a semiconductor substrate; a dummy pattern extending in one direction on the semiconductor substrate; a junction region electrically connecting the dummy pattern to the semiconductor substrate; and a voltage applying unit that is configured to apply a bias voltage to the dummy pattern.

14 Claims, 6 Drawing Sheets

SEMICONDUCTOR INTEGRATED CIRCUIT DEVICES HAVING CONDUCTIVE PATTERNS THAT ARE ELECTRICALLY CONNECTED TO JUNCTION REGIONS

CROSS-REFERENCE TO RELATED APPLICATION

The present application is a divisional of U.S. patent application Ser. No. 12/165,827, filed in the United States Patent Office on Jul. 1, 2008, now U.S. Pat. No. 7,847,339, and claims priority under 35 U.S.C. §119 to Korean Patent Application No. 10-2007-0066181 filed on Jul. 2, 2007 in the Korean Intellectual Property Office, the disclosures of which are incorporated herein by reference in their entirety.

FIELD OF THE INVENTION

The present invention relates to semiconductors, and more particularly, to semiconductor integrated circuit devices and methods of forming such devices.

BACKGROUND

Variable threshold complementary metal oxide semiconductor (VTCMOS) devices are a known type of semiconductor device which can respond rapidly at low voltage levels, exhibit a low threshold voltage, and have reduced leakage currents. VTCMOS devices achieve these characteristics, in part, by controlling a well bias voltage and a substrate bias voltage in a manner that helps stabilize electrical characteristics of the transistors. However, VTCMOS devices also typically require additional wiring for applying the well bias voltage and the substrate bias voltage to the appropriate regions of the device. Providing these additional wirings can complicate the design and/or the device fabrication process.

SUMMARY

Pursuant to certain embodiments of the present invention, semiconductor integrated circuit devices are provided which comprise a semiconductor substrate and a dummy pattern that extends in one direction on the semiconductor substrate. The devices further include a junction region that electrically connects the dummy pattern to the semiconductor substrate. These devices further include a voltage applying unit that is configured to apply a bias voltage to the dummy pattern.

In some embodiments, the semiconductor integrated circuit device may further include a well of a first conductivity type formed in the semiconductor substrate. The junction region may be within this well of the first conductivity type. Moreover, the dummy pattern may be a polysilicon pattern or a metal pattern. The device may also include a contact that is between the junction region and the dummy pattern, where the contact electrically connects the junction region to the dummy pattern. In addition, the device may include a plurality of additional junction regions, wherein at least some of the plurality of additional junction regions are electrically connected to the contact.

Pursuant to further embodiments of the present invention, semiconductor integrated circuit devices are provided which include a semiconductor substrate. A well of a first conductivity type may be in the semiconductor substrate. A polysilicon pattern is on the semiconductor substrate. A junction region is within the well of the first conductivity type, where the junction region electrically connects the polysilicon pattern to the semiconductor substrate. The devices further include a voltage applying unit that is configured to apply a bias voltage to the polysilicon pattern.

In some embodiments, the polysilicon pattern extends in a first direction on the semiconductor substrate, and a plurality of additional junction regions are aligned parallel to the polysilicon pattern. The polysilicon pattern is electrically connected to each of the plurality of additional junction regions through respective ones of a plurality of contacts.

Pursuant to still further embodiments of the present invention, semiconductor integrated circuit devices are provided that have a semiconductor substrate that includes a plurality of first conductivity type wells and a plurality of second conductivity type wells. A first conductive pattern extends in a first direction on the semiconductor substrate and at least partially overlaps the first conductivity type wells. A second conductive pattern extends in the first direction on the semiconductor substrate and at least partially overlaps the second conductivity type wells. A plurality of first junction regions are provided in the first conductivity type wells, each of which electrically connects a respective one of the first conductivity type wells to the first conductive pattern. A plurality of second junction regions are provided in the second conductivity type wells, each of which electrically connects a respective one of the second conductivity type wells to the second conductive pattern.

In some embodiments, the first conductive pattern and/or the second conductive pattern may be a dummy pattern. In some embodiments, the device may further include a first voltage applying unit that is configured to apply a first bias voltage to the first conductive pattern and a second voltage applying unit that is configured to apply a second bias voltage to the second conductive pattern.

Pursuant to still further embodiments of the present invention, semiconductor integrated circuit devices are provided that include a semiconductor substrate of a first conductivity type. A plurality of spaced-apart second conductivity type wells are in the semiconductor substrate. A first conductive pattern extends in a first direction on the semiconductor substrate. A second conductive pattern also extends in the first direction on the semiconductor substrate. A first junction region electrically connects the semiconductor substrate to the first conductive pattern. A second junction region electrically connects at least some of the second conductivity type wells to the second conductive pattern.

In some of these embodiments, the second conductive pattern at least partially overlaps the ones of the plurality of second conductivity type wells that are electrically connected to the second conductive pattern. Moreover, the second conductivity type wells may divide the semiconductor substrate into a plurality of regions, and the first conductive pattern may at least partially overlap the second conductivity type wells and may be electrically connected to each of the plurality of regions in the semiconductor substrate by the first junction region. The first conductive pattern or the second conductive pattern may be a dummy pattern. The first conductive pattern or the second conductive pattern may, for example, comprises a polysilicon pattern or a metal pattern.

In some embodiments, the device may also include a first voltage applying unit that is configured to apply a first bias voltage to the first conductive pattern and a second voltage applying unit that is configured to apply a second bias voltage to the second conductive pattern. The device may also include a first contact that is between the first junction region and the first conductive pattern, where the first contact electrically connects the first junction region to the first conductive pattern. The device may further include a second contact that is between the second junction region and the second conductive pattern, where the second contact electrically connects the second junction region to the second conductive pattern. The second conductive pattern may also include an extension that runs in a second direction that is different than the first direction, where the extension of the second conductive pattern is in direct contact with the second contact.

Pursuant to further embodiments of the present invention, a method of fabricating a semiconductor integrated circuit device is provided in which a well of a first conductivity type is formed in a semiconductor substrate. A gate pattern and a dummy gate pattern are formed which extend in one direction on the semiconductor substrate. A junction region that electrically connects the dummy gate pattern to the semiconductor substrate is formed. Finally, a connection contact for applying a voltage to the junction region and the dummy gate pattern is formed.

DETAILED DESCRIPTION

Figure 1:
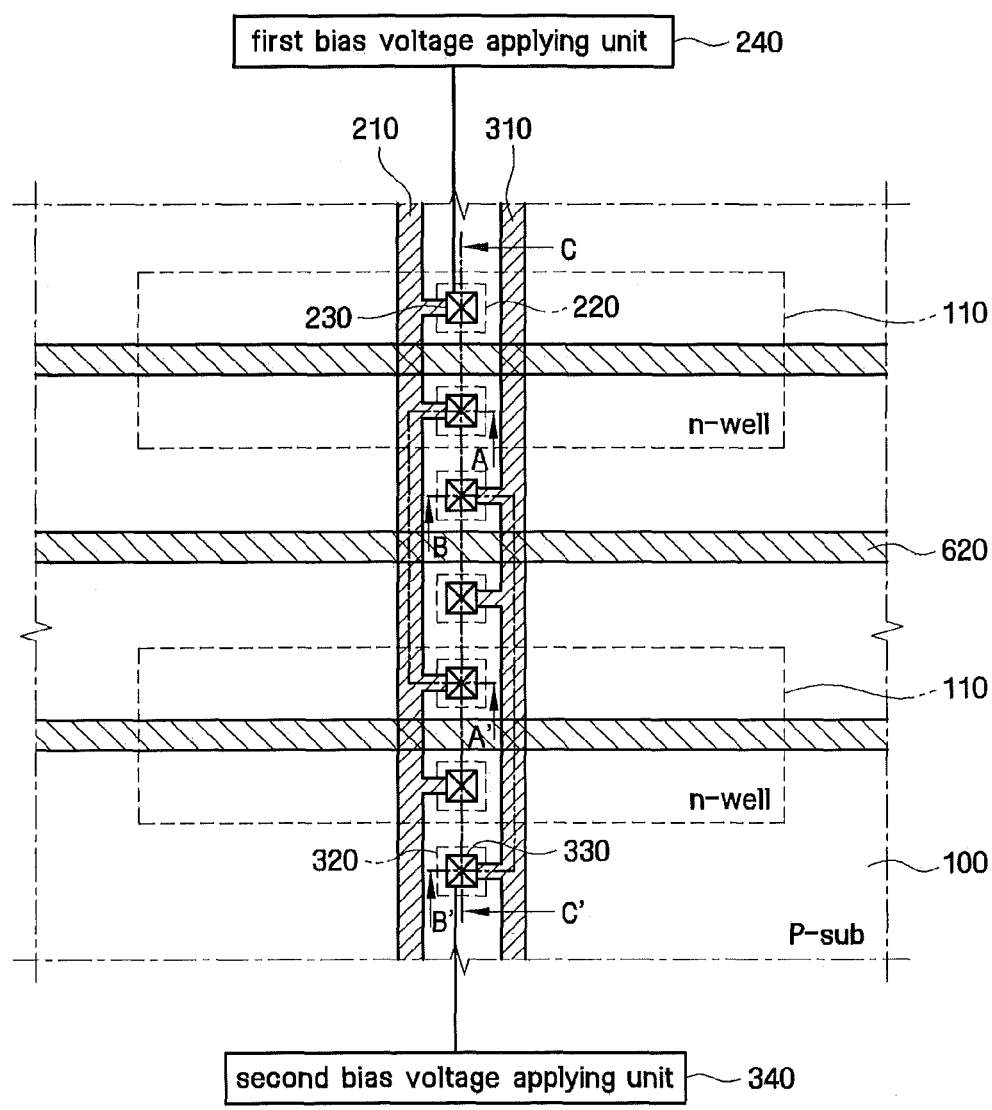
FIG. 1 is a schematic layout of a semiconductor integrated circuit device according to first embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In some embodiments, well-known structures and well-known technologies will not be specifically described. Like reference numerals in the drawings denote like elements, and thus their description will be omitted.

It will be understood that, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items.

It will be understood that, although the terms first, second, etc., may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without changing the scope or content of the present invention.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises", "comprising", "includes" and/or "including," when used in this specification, specify the presence of stated components, steps, operations, regions and/or elements, but do not preclude the presence or addition of one or more other components, steps, operations, regions, elements and/or groups thereof.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "below," "beneath," "lower," "above," "upper," and the like, may be used herein for ease of description to describe one element or component's relationship to another element(s) or component(s) as illustrated in the drawings. It will be understood that the spatially relative terms are intended to encompass different orientations of the element in use or operation in addition to the orientation depicted in the drawings. For example, if the element in the figures is turned over, elements described as "below" or "beneath" other elements would then be oriented "above" the other elements. Thus, the exemplary term "below" can encompass both an orientation of above and below. The element may be otherwise oriented and the spatially relative descriptors used herein interpreted accordingly.

Figure 2A:
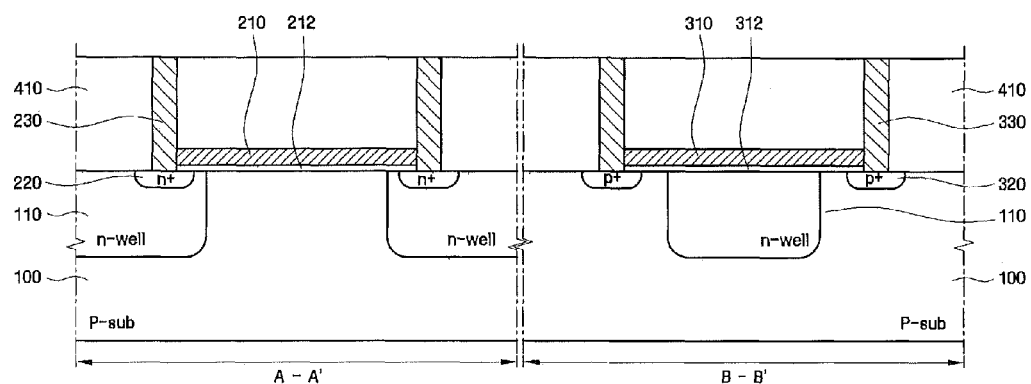
FIG. 2A is a cross-sectional view of the semiconductor integrated circuit device of FIG. 1 taken along lines A-A' and B-B' of FIG. 1.
Figure 2B:
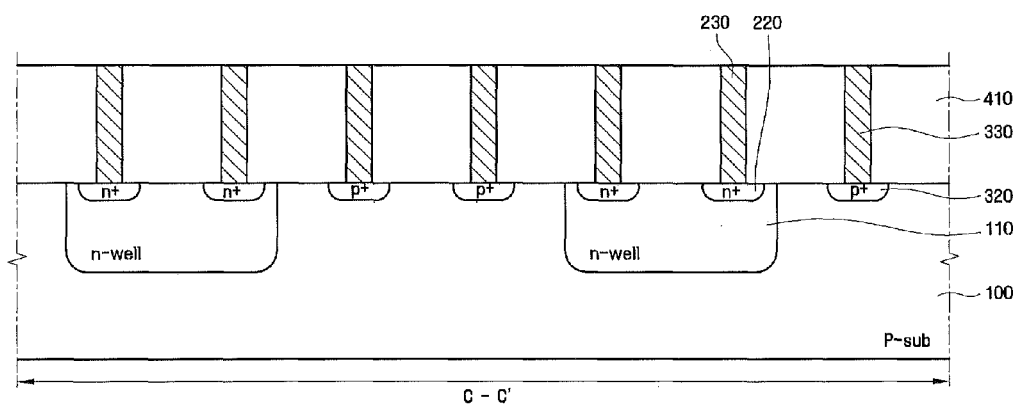
FIG. 2B is a cross-sectional view of the semiconductor integrated circuit device of FIG. 1 taken along the line C-C' of FIG. 1.

Hereinafter, semiconductor integrated circuit devices according to first embodiments of the present invention will be described in detail with reference to FIGS. 1, 2A and 2B. FIG. 1 is a schematic layout of a semiconductor integrated circuit device according to first embodiments of the present invention. FIG. 2A is a cross-sectional view of the semiconductor integrated circuit device of FIG. 1 taken along lines A-A' and B-B' of FIG. 1. FIG. 2B is a cross-sectional view of the semiconductor integrated circuit device of FIG. 1 taken along line C-C' of FIG. 1.

As shown in FIGS. 1, 2A and 2B, a semiconductor integrated circuit device according to the first embodiments of the present invention may include a semiconductor substrate 100 and one or more N-type wells 110 that are formed in the semiconductor substrate 100.

The semiconductor substrate 100 may comprise, for example, a silicon substrate, a silicon on insulator (SOI) substrate, a gallium arsenide substrate or a silicon-germanium substrate. In other embodiments (not shown in the figures), a semiconductor substrate or a non-semiconductor substrate such as a ceramic substrate, a quartz substrate or a display glass substrate may be provided, and a P-type semiconductor epitaxial layer may be grown on this substrate. In such embodiments, the P-type epitaxial layer may serve the function of the semiconductor substrate 100 depicted in FIGS. 1, 2A and 2B, and thus it will be appreciated that, in such embodiments, the P-type epitaxial layer effectively serves as a semiconductor substrate and hence such epitaxial layers will be understood to comprise "semiconductor substrates" for the purposes of the present disclosure. Although a P-type substrate is illustrated in FIGS. 1, 2A and 2B, it will be appreciated that in other embodiments of the present invention an N-type substrate may alternatively (or additionally) be provided.

An isolation region (not shown) is formed on the semiconductor substrate 100, thereby defining an active region. The isolation region may comprise, for example, a field oxide (FOX) formed by a local oxidation of silicon (LOCOS) process or a shallow trench isolation (STI) region.

The N-type wells 110 are formed in the semiconductor substrate 100. The N-type wells 110 may be separated from each other by a predetermined distance. The N-type wells 110 may be formed by implanting a relatively low concentration of N-type impurities into the semiconductor substrate 100. The N-type impurities may comprise, for example, phosphorous (P) or arsenic (As).

Although the N-type wells 110 are illustrated in FIGS. 1, 2A and 2B, it will be appreciated in light of the present disclosure that, in other embodiments of the present invention, P-type wells or both N-type wells 110 and P-type wells may be formed. For example, a semiconductor integrated circuit device having both N-type and P-type wells will be described herein with respect to FIGS. 5 and 6.

As shown in FIGS. 1, 2A and 2B, first and second conductive patterns 210 and 310 extend in one direction on the semiconductor substrate 100 that has the N-type wells 110. As shown in the figures, the first and second conductive patterns 210 and 310 at least partially overlap the N-type wells 110. In the particular embodiment depicted in FIG. 1, the first and second conductive patterns 210 and 310 cross the N-type wells 110.

The first and second conductive patterns 210 and 310 may comprise, for example, polysilicon or metal patterns. In some embodiments, one or both of the first and second conductive patterns 210 and 310 may comprise stacked polysilicon and metal patterns. The first and second conductive patterns 210 and 310 may be dummy patterns, for example, dummy gate patterns. Herein, the term "dummy pattern" refers to a pattern that is formed to form more precise patterns in the device. The dummy patterns are included in many regions such as boundary, end and overlapping regions. Semiconductor integrated circuit devices according to some embodiments of the present invention use these dummy patterns as wirings for applying a bias voltage to a substrate and/or to one or more wells. When the first and second conductive patterns 210 and 310 comprise dummy gate patterns, each of these patterns may have the same structure as a gate stack. Accordingly, gate insulation films 212 and 312 may be formed in lower parts of the first and second conductive patterns 210 and 310, respectively.

As shown in FIGS. 2A and 2B, the first conductive pattern 210 may be electrically connected to the N-type wells 110 by first junction regions 220. The first junction regions 220 may be formed, for example, by implanting a high concentration of N-type impurities into the semiconductor substrate 100. The first junction regions 220 are connected to the N-type wells 110. It will be appreciated that if P-type wells are used instead of the N-type wells 110 then the first junction regions 220 may be formed by injecting a high concentration of P-type impurities into the semiconductor substrate 100. Each of the N-type wells 110 may include one or more first junction regions 220. For example, in FIGS. 1, 2A and 2B, two first junction regions 220 are formed in each of the N-type wells 110.

First contacts 230 are connected to the first conductive pattern 210 and the first junction regions 220. In the embodiment of FIGS. 1, 2A and 2B, the first contacts 230 are directly connected to both the first conductive pattern 210 and the first junction regions 220. A first bias voltage applying unit 240 may be used to apply a well bias voltage to the first conductive pattern 210 and the N-type wells 110 through the first contacts 230. Each of the first contacts 230 may be formed on a respective one of the first junction regions 220. Accordingly, the well bias voltage may be applied to only one of the first contacts 230 in order to apply the well bias voltage to all of the N-type wells 110, which are connected to the first conductive pattern 210, via the first junction regions 220.

The second conductive pattern 310 is electrically connected to the semiconductor substrate 100 by second junction regions 320. The second junction regions 320 may be formed, for example, by implanting a high concentration of P-type impurities into the semiconductor substrate 100. The P-type impurities may be boron (B), boron fluoride ($BF_2$ and $BF_3$), indium (In), and the like. Since the semiconductor substrate 100 is a P-type substrate, the second junction regions 320 are formed by implanting a high concentration of P-type impurities. It will be appreciated that if the semiconductor substrate 100 is an N-type substrate, the second junction regions 320 may be formed by implanting a high concentration of N-type impurities into the substrate. One or more second junction regions 320 may be formed in each of regions into which the semiconductor substrate 100 is divided by the N-type wells 110. In FIGS. 1, 2A and 2B, two second junction regions 320 are formed in each region of the semiconductor substrate 100.

Second contacts 330 are connected to the second conductive pattern 310 and the second junction regions 320. In the embodiment of FIGS. 1, 2A and 2B, the second contacts 330 are directly connected to both the second conductive pattern 310 and the second junction regions 320. A second bias voltage applying unit 340 may be used to apply a substrate bias voltage to the second conductive pattern 310 and the semiconductor substrate 100 through the second contacts 330. Each of the second contacts 330 may be formed on a respective one of the second junction regions 320. Accordingly, the substrate bias voltage may be applied to only one of the second contacts 330 in order to apply the substrate bias voltage to all regions of the semiconductor substrate 100, which are connected to the second conductive pattern 310 via the second conductive pattern 310.

In FIG. 1, reference numeral 620 indicates a metal wiring formed above the first and second conductive patterns 210 and 310, and reference numeral 410 indicates an inter-layer insulation film. For ease of description, the metal wiring 620 is not depicted in the cross-sectional diagrams of FIGS. 2A and 2B (and likewise is not depicted in the cross-sectional diagrams of the embodiments of FIGS. 3-4 and FIGS. 5-6).

The semiconductor integrated circuit device according to the first embodiments of the present invention uses the first and second conductive patterns 210 and 310, which may be dummy gate patterns, as wirings for applying the well bias voltage and the substrate bias voltage, respectively. As such, in some embodiments the device may be formed without including any additional wiring for applying the well bias voltage and the substrate bias voltage. Moreover, the first and second conductive patterns 210 and 310 are connected to the N-type wells 110 and to each of the regions of the semiconductor substrate 100. Therefore, there may be no need to apply a bias voltage to all contacts connected to the N-type wells 110 and the semiconductor substrate 100. If the bias voltage is applied to only one contact, it is also applied to all of the N-type wells 110 and the semiconductor substrate 100. Consequently, the semiconductor integrated circuit device can be more efficiently designed and fabricated, which, in turn, enhances productivity.

Figure 3:
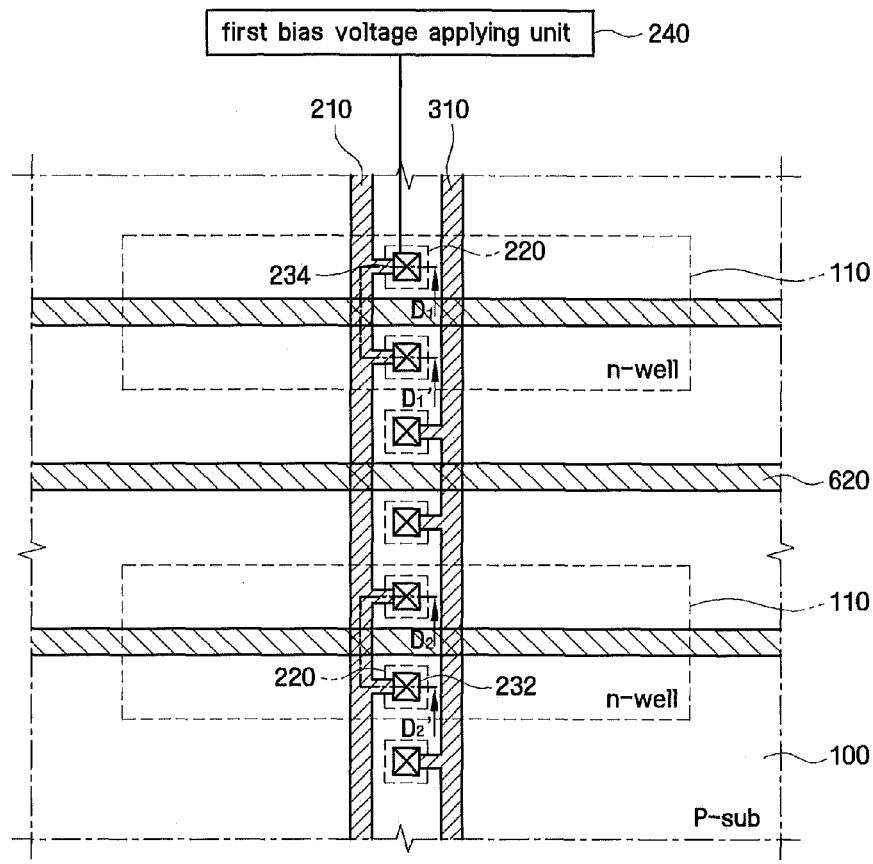
FIG. 3 is a schematic layout of a semiconductor integrated circuit device according to second embodiments of the present invention.
Figure 4:
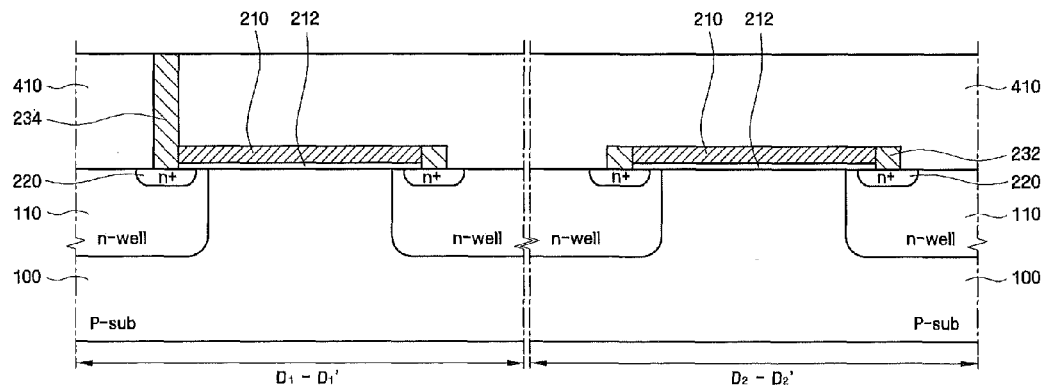
FIG. 4 is a cross-sectional view of the semiconductor integrated circuit device of FIG. 3 taken along lines $D_1$-$D_1$' and $D_2$-$D_2$' of FIG. 3.

Hereinafter, a semiconductor integrated circuit device according to second embodiments of the present invention will be described with reference to FIGS. 3 and 4. FIG. 3 is a schematic layout of a semiconductor integrated circuit device according to the second embodiments of the present invention. FIG. 4 is a cross-sectional view of the semiconductor integrated circuit device taken along lines $D_1$-$D_1'$ and $D_2$-$D_2'$ of FIG. 3.

Referring to FIGS. 3 and 4, the semiconductor integrated circuit device according to the second embodiments of the present invention differs from the semiconductor integrated circuit device according to the first embodiments in that only a first connection contact 234 is connected to an upper part of inter-layer insulation film 410. The contact 234 may be identical to the corresponding contact 230 in FIGS. 1, 2A and 2B. The remaining first contacts 232 which connect first junction regions 220 and first conductive patterns 210 in the embodiment of FIGS. 3 and 4 do not extend to the upper part of the insulation film, as can be seen from FIG. 4.

A first bias voltage applying unit 240 may be used to apply a well bias voltage to the first connection contact 234 (i.e., the first contact which is connected to the upper part of inter-layer insulation film 410). This well bias voltage that is applied to the first connection contact 234 is applied to N-type wells 110 via the first conductive patterns 210, the first contacts 232, and the first junction regions 220. Since the N-type wells 110 are connected to one another by the first conductive patterns 210, even if the well bias voltage is applied only to the first connection contact 234, it may also be applied to all of the N-type wells 110.

Figure 5:
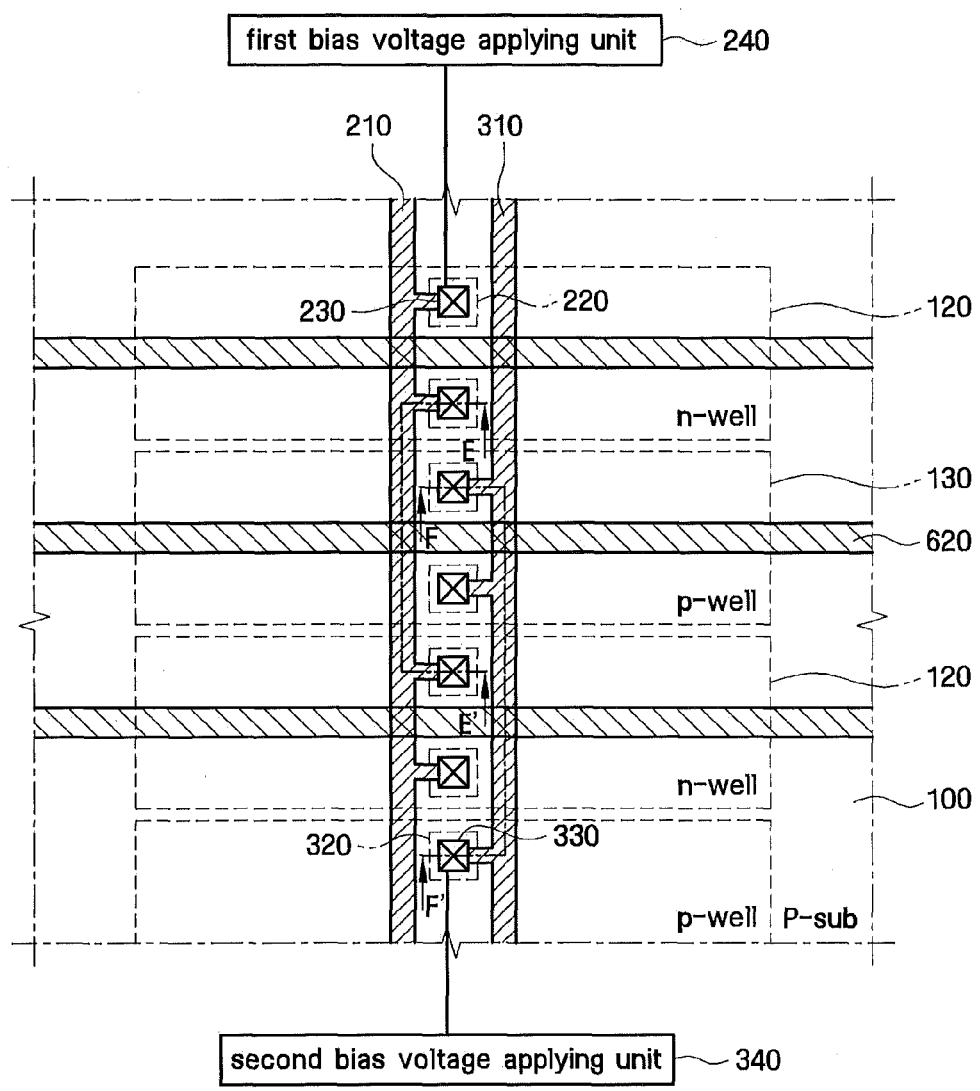
FIG. 5 is a schematic layout of a semiconductor integrated circuit device according to third embodiments of the present invention.
Figure 6:
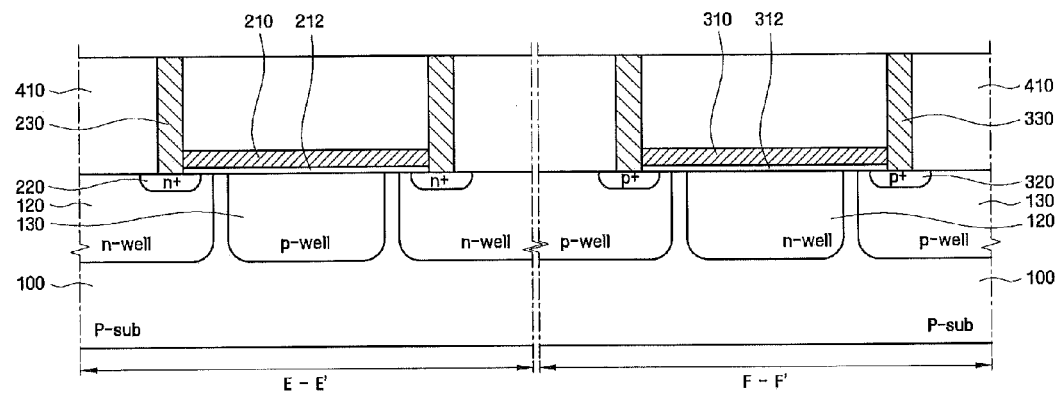
FIG. 6 is a cross-sectional view of the semiconductor integrated circuit device of FIG. 5 taken along lines E-E' and F-F' of FIG. 5.

Hereinafter, a semiconductor integrated circuit device according to third embodiments of the present invention will be described with reference to FIGS. 5 and 6. FIG. 5 is a schematic layout of the semiconductor integrated circuit device according to the third embodiments of the present invention. FIG. 6 is a cross-sectional view of the semiconductor integrated circuit device taken along lines E-E' and F-F of FIG. 5.

Referring to FIGS. 5 and 6, the semiconductor integrated circuit device according to the third embodiments of the present invention includes one or more N-type wells 120 and one or more P-type wells 130 that are formed in a semiconductor substrate 100.

A first conductive pattern 210 is connected to the N-type wells 120 by first junction regions 220, and a well bias voltage is applied using the first bias voltage applying unit 240 to the N-type wells 120 through the first contacts 230 that are connected to the first conductive pattern 210 and the first junction regions 220. A second conductive pattern 310 is connected to the P-type wells 130 by second junction regions 320, and the well bias voltage is applied using the second bias voltage applying unit 340 to the P-type wells 130 through the second contacts 330 that are connected to the second conductive pattern 310 and the second junction regions 320.

Figure 7:
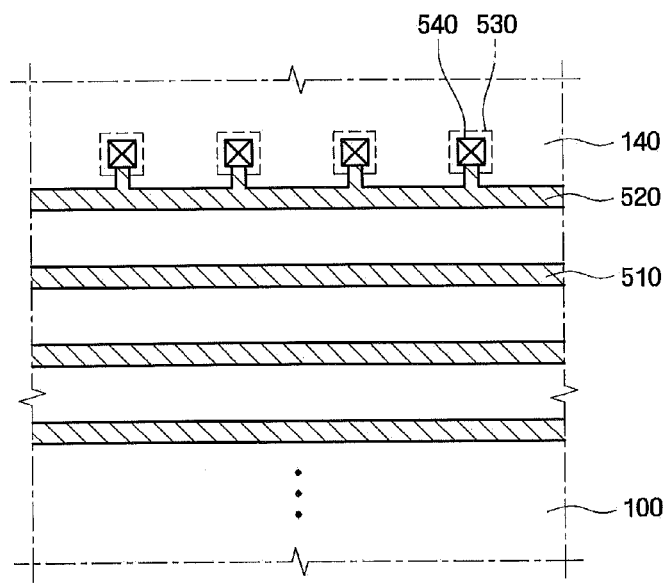
FIG. 7 is a schematic layout of a semiconductor integrated circuit device according to fourth embodiments of the present invention.

Hereinafter, a semiconductor integrated circuit device according to a fourth embodiments of the present invention will be described with reference to FIG. 7. FIG. 7 is a schematic layout of the semiconductor integrated circuit device according to the fourth embodiments of the present invention.

Referring to FIG. 7, the semiconductor integrated circuit device according to the fourth embodiments of the present invention includes a well 140 of a first conductivity type, a gate pattern 510 extending in one direction on the well 140 and a dummy gate pattern 520 that is separated from the gate pattern 510 and extending in the same direction as the gate pattern 510. A plurality of junction regions 530 are electrically connected to the dummy gate pattern 520 through respective ones of a plurality of connection contacts 540. The junction regions 530 may directly connect to the well 140 of the first conductivity type.

In the semiconductor integrated circuit device according to the fourth embodiments of the present invention, the junction regions 530 are formed in the well 140 of the first conductivity type, and a well bias voltage is applied to the junction regions 530. When a single conductive transistor is formed in a wide region, if a substrate bias voltage or a well bias voltage is applied to one of the junction regions 530, it is not evenly applied to a semiconductor substrate 100 or the well 140 of the first conductivity type. However, when the junction regions 530 are formed using the dummy gate pattern 520 as illustrated in FIG. 7, if a bias voltage is applied to the dummy gate pattern 520, it is applied to each of the junction regions 530 along the dummy gate pattern 520. Accordingly, the bias voltage can be evenly applied to the semiconductor substrate 100 or the well 140 of the first conductivity type.

Figure 8:
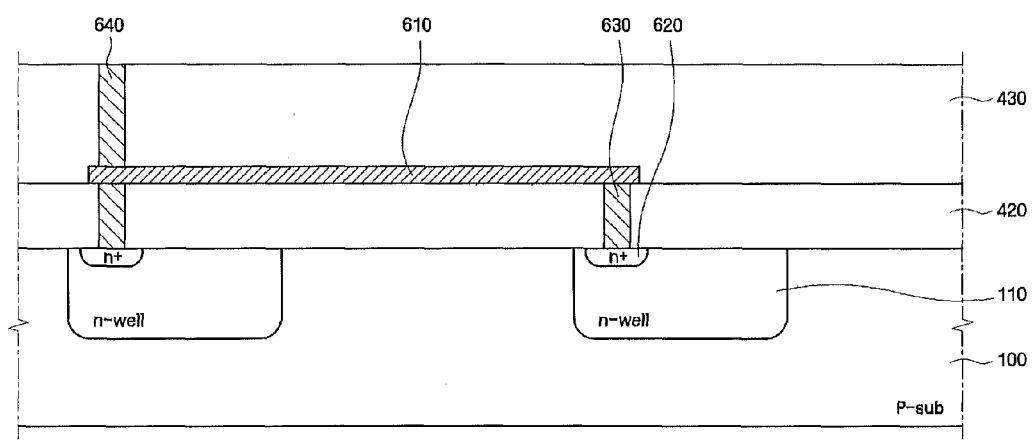
FIG. 8 is a schematic layout of a semiconductor integrated circuit device according to fifth embodiments of the present invention.

Hereinafter, a semiconductor integrated circuit device according to fifth embodiments of the present invention will be described with reference to FIG. 8. FIG. 8 is a schematic layout of the semiconductor integrated circuit device according to the fifth embodiments of the present invention.

As shown in FIG. 8, the semiconductor integrated circuit device according to the fifth embodiments of the present invention may apply a bias voltage using a dummy metal wiring 610 that is disposed, for example, at a first level in the device. The semiconductor integrated circuit device according to the fifth embodiments of the present invention includes the dummy metal wiring 610, junction regions 620, junction contacts 630, and a voltage applying contact 640. Thus, the semiconductor integrated circuit device according to the fifth embodiments of the present invention uses the dummy metal wiring 610 to apply the bias voltage. It will be apparent to those of ordinary skill in the art in light of the present disclosure that both a dummy gate pattern and the dummy metal wiring 610 can be used as to apply bias voltages to the wells and/or substrate.

As described above, a method of fabricating a semiconductor integrated circuit devices according to embodiments of the present invention may provides one or more of the following advantages.

First, in some embodiments, a dummy gate pattern may be used as a wiring for applying a well bias voltage and a substrate bias voltage. Such embodiments may reduce or eliminate the need for additional wiring for applying the well bias voltage and the substrate bias voltage.

Second, a conductive pattern is connected to a plurality of wells. As such, it may not be necessary to apply a bias voltage to every one of the wells. Thus, the semiconductor integrated circuit device can be more efficiently designed and fabricated, thereby enhancing productivity.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A semiconductor integrated circuit device comprising:
   a semiconductor substrate;
   a dummy pattern extending in one direction on the semiconductor substrate;
   a junction region electrically connecting the dummy pattern to the semiconductor substrate;
   a voltage applying unit that is configured to apply a bias voltage to the dummy pattern; and
   a contact on the junction region, wherein the contact electrically connects the junction region to the dummy pattern.

2. The semiconductor integrated circuit device of claim 1, further comprising a well of a first conductivity type formed in the semiconductor substrate, wherein the junction region is within the well of the first conductivity type.

3. The semiconductor integrated circuit device of claim 2, wherein the dummy pattern comprises a polysilicon pattern or a metal pattern.

4. The semiconductor integrated circuit device of claim 1, further comprising a plurality of additional junction regions, wherein at least some of the plurality of additional junction regions are electrically connected to the contact.

5. A semiconductor integrated circuit device comprising:
   a semiconductor substrate;
   a well of a first conductivity type formed in the semiconductor substrate;
   a polysilicon pattern on the semiconductor substrate;
   a junction region within the well of the first conductivity type, the junction region electrically connecting the polysilicon pattern to the semiconductor substrate;
   a voltage applying unit that is configured to apply a bias voltage to the polysilicon pattern; and
   a contact on the junction region, wherein the contact electrically connects the junction region to the polysilicon pattern.

6. The semiconductor integrated circuit device of claim 5, wherein the polysilicon pattern extends in a first direction on the semiconductor substrate, a plurality of additional junction regions are aligned parallel to the polysilicon pattern, and the polysilicon pattern is electrically connected to each of the plurality of additional junction regions through respective ones of a plurality of contacts.

7. The semiconductor integrated circuit device of claim 2, wherein the voltage applying unit is configured to apply the bias voltage to the well of the first conductivity type via the dummy pattern.

8. The semiconductor integrated circuit device of claim 2, further comprising an additional well of the first conductivity type formed in the semiconductor substrate, an additional junction region within the additional well of the first conductivity type, a first contact that is between the junction region and the dummy pattern, and a second contact that is between the additional junction region and the dummy pattern.

9. The semiconductor integrated circuit device of claim 8, wherein the voltage applying unit is configured to apply the bias voltage to both the well of the first conductivity type and the additional well of the first conductivity type via the dummy pattern.

10. A semiconductor integrated circuit device comprising:
    a semiconductor substrate;
    a dummy pattern extending in one direction on the semiconductor substrate;
    a junction region electrically connecting the dummy pattern to the semiconductor substrate;
    a voltage applying unit that is configured to apply a bias voltage to the dummy pattern;
    a well of a first conductivity type formed in the semiconductor substrate, wherein the junction region is within the well of the first conductivity type; and
    an additional dummy pattern extending in the same direction as the dummy pattern, first and second additional junction regions, and a second voltage applying unit,
    wherein the second voltage applying unit is configured to apply a second bias voltage to the semiconductor substrate on either sides of the well of the first conductivity type via the respective first and second additional junction regions.

11. The semiconductor integrated circuit device of claim 10, further comprising a first additional contact that is between the first additional junction region and the additional dummy pattern, and a second additional contact that is between the second additional junction region and the additional dummy pattern.

12. The semiconductor integrated circuit device of claim 11, wherein the second voltage applying unit is configured to apply the second bias voltage to both the semiconductor substrate through both the first additional contact and the second additional contact.

13. The semiconductor integrated circuit device of claim 8, wherein the dummy pattern crosses over the well of the first conductivity type and the additional well of the first conductivity type.

14. The semiconductor integrated circuit device of claim 5, further comprising a contact that is between the junction region and the polysilicon pattern, wherein the contact directly electrically connects the junction region to the polysilicon pattern.

* * * * *